United States Patent [19]

Yang

[11] Patent Number: 5,691,240
[45] Date of Patent: Nov. 25, 1997

[54] METHOD FOR FORMING BLANKET PLANARIZATION OF THE MULTILEVEL INTERCONNECTION

[75] Inventor: Ching-Nan Yang, Hsinchu, Taiwan

[73] Assignee: Mosel Vitelic Inc., Hsinchu, Taiwan

[21] Appl. No.: 754,602

[22] Filed: Nov. 20, 1996

[51] Int. Cl.⁶ .................................................. H01L 21/44
[52] U.S. Cl. ......................... 437/195; 437/192; 437/190; 437/198
[58] Field of Search ......................... 437/195, 192, 437/190, 198, 238, 239

[56] References Cited

U.S. PATENT DOCUMENTS

| | | |
|---|---|---|
| 5,270,233 | 12/1993 | Hamatake .................... 437/238 |
| 5,286,664 | 2/1994 | Horiuchi ...................... 437/235 |
| 5,472,898 | 12/1995 | Hong et al. ..................... 437/48 |
| 5,529,946 | 6/1996 | Hong ............................ 437/52 |
| 5,561,076 | 10/1996 | Yoshino ....................... 437/238 |

*Primary Examiner*—Charles L. Bowers, Jr.
*Assistant Examiner*—Lynn A. Gurley
*Attorney, Agent, or Firm*—Bacon & Thomas

[57] ABSTRACT

An improved process for forming blanket planarization of the multilevel interconnection of a semiconductor substrate by LPD-SiO$_2$ (Liquid-Phase Deposition) selective deposition technique which LPD-SiO$_2$ is not deposited on silicon nitride, and forming silicon dioxide to achieve blanket planarization of multilevel interconnection.

13 Claims, 3 Drawing Sheets

METHOD FOR FORMING BLANKET PLANARIZATION OF THE MULTILEVEL INTERCONNECTION

BACKGROUND OF THE INVENTION

1. Field of the Invention

The invention relates generally to the manufacture of semiconductor devices having a multilevel interconnection structure. More specifically, the invention relates to a novel method of forming blanket planarization of the multilevel interconnection in such devices.

2. Description of the Prior Art

In the fabrication of semiconductor devices, the metal conductor lines are used to interconnect the components in the device circuits. The metal conductor lines serve to interconnect discrete devices, and thus form integrated circuits. The metal conductor lines are further insulated from the next interconnection level by thin layers of insulating material and the holes formed through the insulating layers provide electrical access between successive conductive interconnection layers. In such wiring processes, it is desirable that the insulating layers have smooth surface topography, because the insulating layers with rough surface topography are difficult to lithographically image and pattern layers. Also, rough surface topography results in poor step coverage by subsequently deposited layers, the discontinuity of layers across steps, and the void formation between topographic features. Poor step coverage by deposited layers and void formation between topographic features result in degraded process yield and poorer reliability of integrated circuits. As wiring densities in semiconductor circuit chips increase, multiple wiring levels are required to achieve interconnection of the devices and, therefore, planarization of the interlevel dielectric material becomes a critical step in the fabrication process.

In the semiconductor industry, the conventional fabrication process of the planarization is spin-on glass (SOG) technique which is a local planarization of semiconductor substrate. The base theorem is that a dielectric material melted in the solvents is spun on semiconductor substrate. By the way, the dielectric material can flow freely on the surface of the semiconductor substrate, and it can fill easily into the holes in the semiconductor substrate, in addition to the solvents utilized to melt the dielectric material are driven off via thermal process such as baking and the remaining solid film exhibits properties similar to those of silicon dioxide to achieve the local planarization. Spin-on glass is a interlevel-dielectric material that is applied in liquid form on the surface of the semiconductor substrate, therefore, it exhibits the planarization capability. SOG can fill narrower spaces without causing voids than CVD can do to the interlevel dielectric films. When the sapcing is narrower, the topographic features of the semiconductor substrate is excellently planarized via SOG, but the wider spacing will result in the weaker planarization capabilities. Therefore, the planarization capability is limited via SOG, and SOG is a local planarization process.

In addition, other shortcomings of the SOG film include: the particles formed facilely, the phenomenon of crack and peeling on the surface of the SOG film, and the problem of outgassing from the remains of the solvents. The particles are from the remains of the SOG film itself, and outgassing is from the remains of the solvents and the moisture by incompletely thermal process. These defects normally result in the amount of product reducing and low reliability.

Another conventional fabrication process of the planarization is chemical mechanical polishing (CMP) technique which is a blanket planarization of semiconductor substrate. The base theorem using a mechanical polishing method by a knife as milling accompanied with suitable chemical reagent provides a blanket planarization technique to planarize the surface of the topographic features of the semiconductor substrate. Actually, CMP apparatus primarily consists of a polishing table and a holder for holding the wafer. The rotary holder holds the back of the wafer against the rotary polishing table on which a polishing pad spreads with a suitable pressure. The reagents such as slurry are supplied continuously on the polishing table along a transfer line and the surface of the topographic features are polished by mechanical polishing to achieve the blanket planarization.

The process of the CMP relates to the complex chemical responds and the questions of the mechanical dynamics, therefore, the control of CMP becomes very difficult. As previously mentioned, the factors including the component of slury, the pressure between the wafer and the polishing pad, the rotary velocity of polishing, the material of the polishing pad, the size distribution of the particles in slurry, the supply velocity of slurry, the thermal control, PH of slurry and the material of the polished wafer etc. can influence the process of the planarization in semiconductor techniques. In addition, the factors farther comprise the un-effective control of CMP endpoint-detected and the control of the pollution sources. These factors will influence the process of planarization.

SUMMARY OF THE INVENTION

It is a primary object of the prevent invention to provide an novel fabrication process for forming blanket planarization of the multilevel interconnect.

It is another object of the prevent invention to provide a novel deposition method for improving LPD-SiO$_2$ selective deposition technique, and any metal material with low resistance appropriate as a wiring line can be applied to the multilevel interconnect.

Accordingly, the prevent invention provides a method of forming blanket planarization of the multilevel interconnection in such devices, and the method is disclosured following:

A first dielectric layer is deposited over a semiconductor substrate, next, a first connect window is formed using the known photolithography and etching techniques. A glue layer, for example being a titanium nitride (TiN) film, is then deposited on the first dielectric layer and coated on the surface of the first connect window to enhance the adhesion capacities of barrier layer between tungsten film and metal layer. Tungsten film is deposited on the titanium nitride film via chemical vapor deposition (CVD) to fill the first connect window. Next, tungsten film is back-etched by dry-etching as a tungsten plug. A first interconnection layer is formed on the exposed surface in the above devices. Then, a silicon nitride (SiN) film is deposited on the first interconnection layer, and a metal pattern is formed by photolithography and etching techniques. Next, another silicon nitride film is deposited over metal pattern and the first dielectric layer, and silicon nitride spacer is formed to enclose a metal pattern by anisotropic etch. After forming silicon nitride spacer, silicon dioxide layer is formed on the first dielectric layer by LPD-SiO$_2$ (Liquid-Phase Deposition) selective deposition techniques which LPD-SiO$_2$ is not deposited on silicon nitride to achieve blanket planarization of the multilevel interconnection. In accordance with the methods disclosed herein, a second dielectric layer is deposited on the exposed surface in the above devices, and as the above stated method, a second connect window is formed by photolithography and etching techniques. Titanium nitride and tungsten is deposited sequentially, and then tungsten film is back-etched. Finally, a second interconnect layer is formed on the exposed surface in the above devices. Depending on the require of fabrication process of a semiconductor device, the interconnect layers may be three or at least three layers, then repeating the above stated techniques to achieve multilevel interconnection.

DESCRIPTION OF THE PREFERRED EMBODIMENT

The following is a description of the structure and fabrication method of the present invention. The preferred embodiment structure will be described first along with a description of modifications. A preferred method forming the structure will then be described.

Figure 1:
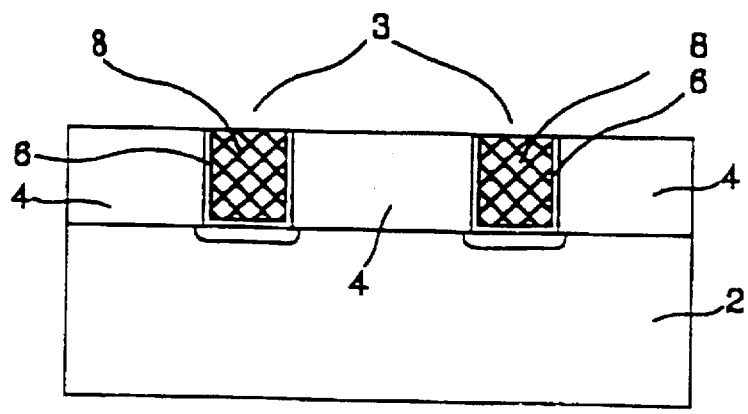
FIG. 1 is a cross sectional view of a connect window and a tungsten plug formed in accordance with a method disclosed herein.

Referring first to FIG. 1, a first dielectric layer 4 is boron phosphosilicate glass (BPSG) deposited on MOS device 2 in a semiconductor substrate at the thickness of about 6000 to 7000 Angstroms by chemical vapor deposition (CVD). A first connect window 3 is formed by photolithography and etching techniques to etch the first dielectric layer 4. A first glue layer 6, for example being a titanium nitride (TiN) film, is then deposited on the first dielectric layer 4 and coated on the surface of the first connect window 3 to enhance the adhesion capacities of barrier layer between tungsten film and under metal layer at the thickness of about 500 to 800 Angstroms. A first tungsten film is deposited on the first titanium nitride film 6 via chemical vapor deposition (CVD) to fill the first connect window 3. Next, the first tungsten film is back-etched by dry-etching as a first tungsten plug 8.

Figure 2:
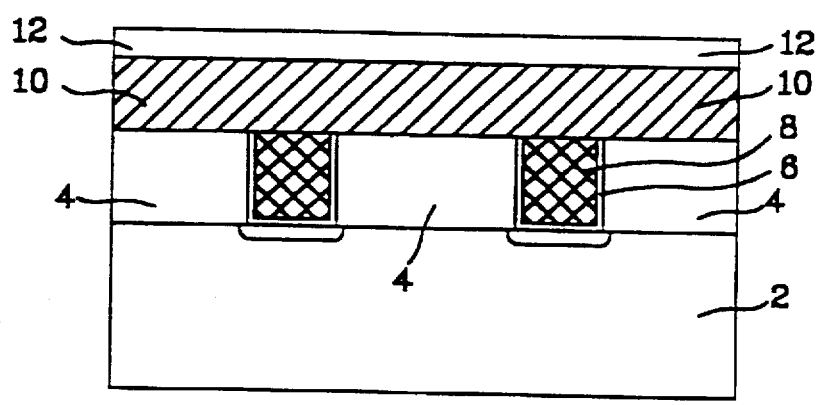
FIG. 2 is a cross sectional view of a first interconnect layer formed and a silicon nitride layer deposited after the device fabrication of FIG. 1.
Figure 3:
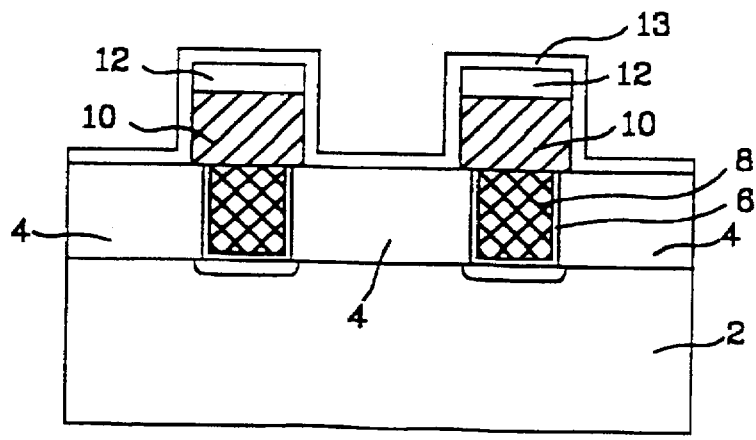
FIG. 3 is a cross sectional view of a metal pattern formed and a silicon nitride layer deposited after the device fabrication of FIG. 2.
Figure 4:
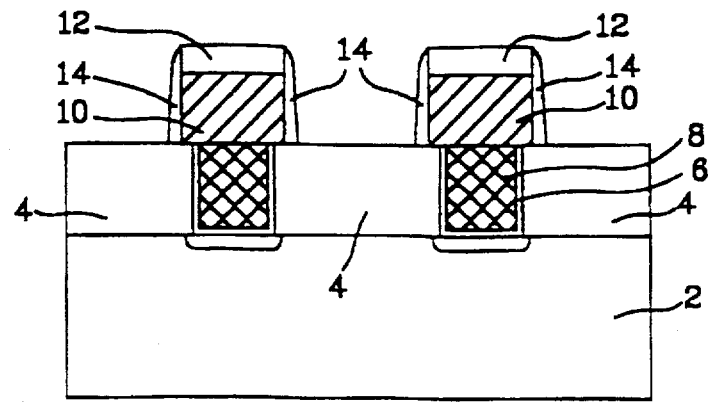
FIG. 4 is a cross sectional view of a silicon nitride spacer formed to enclose the metal pattern by anisotropic etch after the device fabrication of FIG. 3.

Referring next to FIG. 2, a first interconnection layer 10 is formed over the first dielectric layer 4 and the first tungsten plug 8. The first interconnection layer 10 is formed from the conductive material, typically a metal such as Aluminum Silicon Copper Alloy (AlSiCu), at the thickness of about 4000 to about 6000 Angstroms. Then, a first silicon nitride (SiN) film 12 is deposited on the first interconnection layer 10 at the thickness between about 1500 to 2500 Angstroms. Metal pattern 10 is formed by photolithography and etching techniques to etch the first silicon nitride film 12 and the first interconnection layer 10 as shown in FIG. 3.

Figure 5:
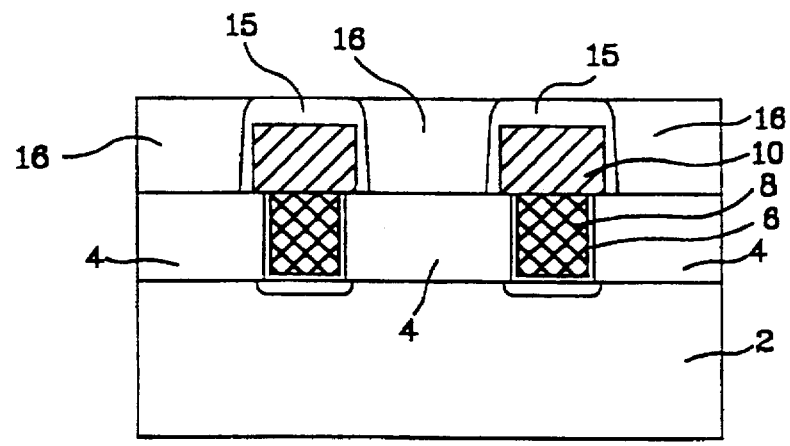
FIG. 5 is a cross sectional view of a silicon dioxide layer formed by LPD-SiO$_2$ selective deposition technique after the device fabrication of FIG. 5.

A second silicon nitride layer 13 is deposited on the exposed surface. The thickness of silicon nitride layer 13 can be in the range of about 2000 Angstroms. A silicon nitride spacer 14 is formed to enclose metal pattern 10 by anisotropic etch., and a barrier layer 15 is formed as shown in FIG. 5.

The technique "A Selective SiO$_2$ Film-Formation Technology Using Liquid-Phase Deposition for Fully Planarizated Multilevel interconnections" applied by Tetsuya Homma, Takuya Katoh et at, points out that the LPD-SiO$_2$ film can be selectively formed on polysilicon layer but can not be formed on photoresist patterns. By experiment, the LPD-SiO$_2$ film can neither be formed on photoresist patterns nor be formed on silicon nitride layer. Therefore, A silicon dioxide layer 16 is formed on the first dielectric layer 4 by LPD-SiO$_2$ (Liquid-Phase Deposition) selective deposition technique non-deposited on silicon nitride to achieve blanket planarization of multilevel interconnection.

Figure 6:
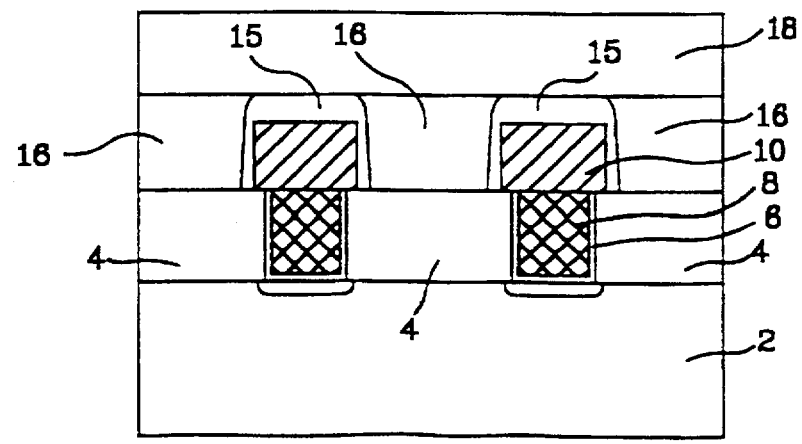
FIG. 6 is a cross sectional view of a second dielectric layer formed after the device fabrication of FIG. 5.

Referring next to FIG. 6, the material of a second dielectric layer 18 is TEOS-SiO$_2$ deposited on the exposed surfaces in the above stated devices by PECVD at the thickness of about 4000 to 6000 Angstroms. The second dielectric layer 18 is a dielectric layer to divide the second interconnection layer 22 as shown in FIG. 8.

Figure 7:
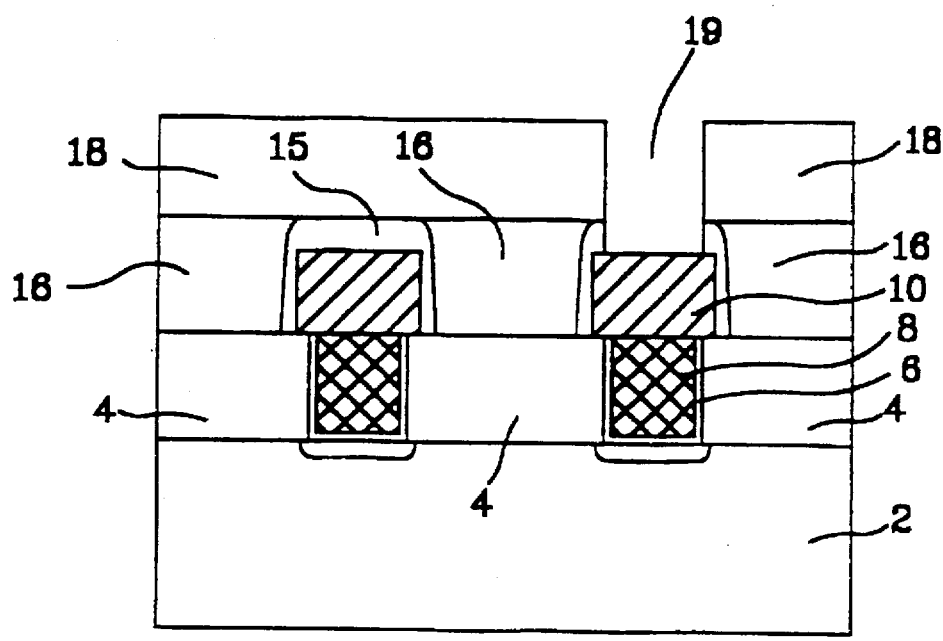
FIG. 7 is a cross sectional view of a second connect window formed after the device fabrication of FIG. 6.

Referring next to FIG. 7, a second connect window 19 is formed by photolithography and etching techniques to etch the second dielectric layer 18. The second connect window 19 provides electrical access to the first interconnection layer 10.

Figure 8:
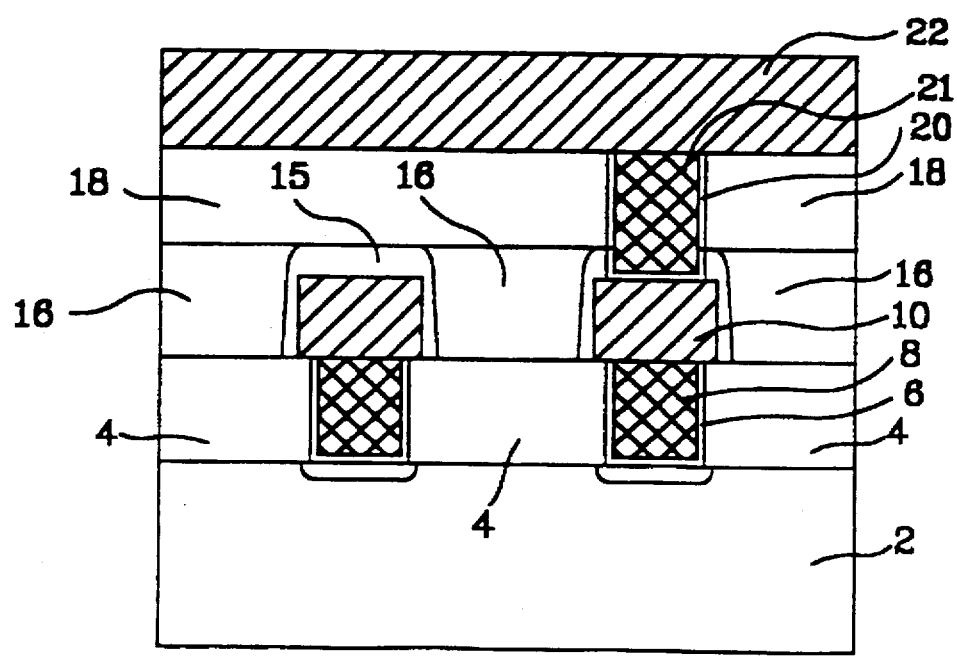
FIG. 8 is a cross sectional view of a tungsten plug formed and a second interconnect layer deposited after the device fabrication of FIG. 7.

Referring next to FIG. 8, a second titanium nitride film and a second tungsten film are deposited sequentially, then, the second tungsten film is back-etched and a second tungsten plug 21 is formed. Next, a second interconnect layer 22 is formed on the exposed surfaces in the above stated devices. The second interconnect layer 22 is formed from conductive material, typically a metal such as Aluminum Silicon Copper Alloy (AlSiCu), and the thickness of the second interconnect layer 22 can be in the range of about 5000 to about 7000 Angstroms. In accordance with the methods disclosed herein, depending on the requirement of fabrication process of a semiconductor device, the interconnect layers may be three or at least three layers, then repeating the above stated steps from FIG. 2 to FIG. 8 to achieve multilevel interconnection.

Although specific embodiments have been illustrated and described, it will be obvious to those skilled in the art that various modification may be made without departing from the spirit which is intended to be limited solely by the appended claims.

What is claimed is:

1. A method for forming blanket planarization of a multilevel interconnected device, comprising the steps of:

forming a first dielectric layer on a MOS device in a semiconductor substrate;

forming a first connect window by etching a portion of said first dielectric layer;

forming a first metal nitride as an adhesion layer on said first dielectric layer and coating on the surface of said first connect window;

forming a first tungsten layer on said first metal nitride;

back-etching said first tungsten layer to form a first tungsten plug;

forming a first interconnection layer on said first dielectric layer and said first tungsten plug;

forming a first silicon nitride layer on said first interconnection layer;

forming a metal pattern by etching said first silicon nitride layer and said first interconnection layer;

forming a second silicon nitride layer on said metal pattern and said first dielectric layer;

forming a spacer by anisotropically etching said second silicon nitride layer to enclose said metal pattern;

forming a silicon dioxide layer on said first dielectric layer by LPD-SiO$_2$ selective deposition technique, said LPD-SiO$_2$ being not deposited on silicon nitride to achieve multilevel interconnection;

forming a second dielectric layer on said silicon dioxide layer and said metal pattern;

forming a second connect window by etching a portion of said second dielectric layer;

forming a second metal nitride as an adhesion layer on said second dielectric layer, thereby coating on the surface of said second connect window;

forming a second tungsten layer on said second metal nitride;

back-etching said second tungsten layer to form a second tungsten plug; and forming a second interconnection layer on said second dielectric layer and said second tungsten plug.

2. The method of claim 1, wherein said first dielectric layer is made from boron phosphosilicate glass by chemical vapor deposition at the thickness of about 6000 to 7000 Angstroms.

3. The method of claim 1, wherein said first metal nitride and said second metal nitride are both titanium nitride at the thickness of about 500 to 800 Angstroms.

4. The method of claim 1, wherein said first tungsten layer and said second tungsten layer are both at the thickness of about 6000 to 8000 Angstroms.

5. The method of claim 1, wherein said first interconnection layer is aluminum silicon copper alloy at the thickness of about 4000 to 6000 Angstroms.

6. The method of claim 1, wherein said first interconnection layer is aluminum at the thickness of about 4000 to 6000 Angstroms.

7. The method of claim 1, wherein said first interconnection layer is copper at the thickness of about 4000 to 6000 Angstroms.

8. The method of claim 1, wherein said first silicon nitride layer is at thickness of about 1500 to 2500 Angstroms.

9. The method of claim 1, wherein the width of said spacer is between about 0.14 um and about 0.18 um.

10. The method of claim 1, wherein said second dielectric layer is made from TEOS-SiO$_2$ by plasma chemical vapor deposition at the thickness of about 4000 to 6000 Angstroms.

11. The method of claim 1, wherein said second interconnection layer is aluminum silicon copper alloy at the thickness of about 4000 to 6000 Angstroms.

12. The method of claim 1, wherein said second interconnection layer is aluminum at the thickness of about 4000 to 6000 Angstroms.

13. The method of claim 1, wherein said second interconnection layer is copper at the thickness of about 4000 to 6000 Angstroms.

* * * * *